United States Patent
Nagaya et al.

(10) Patent No.: US 6,734,607 B2
(45) Date of Patent: May 11, 2004

(54) INTEGRALLY FIRED, LAMINATED ELECTROMECHANICAL TRANSDUCING ELEMENT

(75) Inventors: Toshiatsu Nagaya, Kuwana (JP); Youta Iwamoto, Inabe-gun (JP); Hitoshi Shindo, Nishio (JP); Atsuhiro Sumiya, Nishio (JP); Eturo Yasuda, Nishio (JP)

(73) Assignees: Denso Corporation, Kariya (JP); Nippon Soken, Inc., Nishio (JP)

( * ) Notice: Subject to any disclaimer, the term of this patent is extended or adjusted under 35 U.S.C. 154(b) by 0 days.

(21) Appl. No.: 10/029,005

(22) Filed: Dec. 28, 2001

(65) Prior Publication Data

US 2002/0150508 A1 Oct. 17, 2002

(30) Foreign Application Priority Data

| Dec. 28, 2000 | (JP) | 2000-400210 |
| Dec. 28, 2000 | (JP) | 2000-400211 |
| Dec. 28, 2000 | (JP) | 2000-400212 |
| Dec. 28, 2000 | (JP) | 2000-400213 |
| Dec. 10, 2001 | (JP) | 2001-376241 |
| Dec. 10, 2001 | (JP) | 2001-376242 |
| Dec. 10, 2001 | (JP) | 2001-376243 |
| Dec. 10, 2001 | (JP) | 2001-376244 |

(51) Int. Cl.$^7$ ................................ H01L 41/08
(52) U.S. Cl. ........................ 310/363; 310/328
(58) Field of Search ................ 310/328, 363, 310/366, 364

(56) References Cited

U.S. PATENT DOCUMENTS 4,845,399 A * 7/1989 Yasuda et al. .............. 310/366
5,233,260 A * 8/1993 Harada et al. .............. 310/328
6,232,701 B1 * 5/2001 Schuh et al. ............... 310/328

FOREIGN PATENT DOCUMENTS

| JP | A-3-184386 | 8/1991 |
| JP | A-5-82387 | 4/1993 |
| JP | A-5-304043 | 11/1993 |
| JP | A-8-255509 | 10/1996 |
| JP | 3142013 | 12/2000 |

* cited by examiner

*Primary Examiner*—Mark Budd
(74) *Attorney, Agent, or Firm*—Nixon & Vanderhye P.C.

(57) ABSTRACT

An integrally fired, laminated electromechanical transducing element, fabricated using an inexpensive electrode material and having the electrode characteristic at least equivalent to that of the Ag—Pd electrode, is disclosed. Especially, in the integrally fired, laminated electromechanical transducing element according to the invention, (A) the rigidity of the internal electrode layers is low and the internal stress generated at the time of expansion or contraction of the ceramic layers is small, (B) the antimigration characteristic is superior, (C) the charge loss is small, the heat conductivity is high and the heat radiation characteristic is superior, and/or (D) the bonding strength between the ceramic layers and the electrode layers is high. The integrally fired, laminated electromechanical transducing element (1) according to the invention comprises, for example, an integrally fired laminate member fabricated by integrally firing a plurality of the ceramic layers (11) of piezoelectric ceramic or electrostrictive ceramic and the internal electrode layers (21, 22) interposed between the ceramic layers (11). The main component of the internal electrode layers (21, 22) is a base metal having a rigidity of not more than 160 GPa.

5 Claims, 9 Drawing Sheets

Cu DISTRIBUTION

O DISTRIBUTION

Cu DISTRIBUTION

O DISTRIBUTION

Cu DISTRIBUTION

O DISTRIBUTION

Cu DISTRIBUTION

O DISTRIBUTION

Cu DISTRIBUTION
O DISTRIBUTION

Cu DISTRIBUTION
O DISTRIBUTION

INTEGRALLY FIRED, LAMINATED ELECTROMECHANICAL TRANSDUCING ELEMENT

BACKGROUND OF THE INVENTION

1. Field of the Invention

The present invention relates to an integrally fired, laminated electromechanical transducing element employing a piezoelectric or electrostrictive material.

2. Description of the Related Art

The integrally fired, laminated electromechanical transducing element used for an actuator, a piezoelectric transducer or an ultrasonic motor is fabricated by firing a plurality of ceramic layers, composed of piezoelectric ceramic or electrostrictive ceramic, integrally with internal electrode layers interposed between the ceramic layers.

This integrally fired, laminated electromechanical transducing element produces an inverse piezoelectric effect of generating a displacement upon application of a voltage thereto, and therefore a stress is generated between the internal electrodes and the ceramic layers. Further, another basic characteristic of this element is generating heat upon repeated application of a voltage thereto.

Thus, the following characteristics are required of the internal electrode layers:

1. low electric resistance and small loss of the electrical charge,
2. high heat conductivity and superior heat radiation characteristics,
3. superior antimigration characteristics,
4. a low rigidity and a low internal stress so as not to generate cracks or the like,
5. a high a bonding strength with ceramic, without separating in use, and
6. low cost.

With the conventionally integrally fired, laminated electromechanical transducing element, an Ag—Pd alloy is widely used as an electrode material. Although high in conductivity and comparatively inexpensive, the reliability of Ag itself is low, as it has a low melting point of 960° C. and easily migrates. On the other hand, Pd, though expensive, has a high melting point. Therefore, an Ag—Pd alloy material can produce an electrode material having a high melting point with the migration suppressed (Japanese Unexamined Patent Publication No. 5-304043). Thus, the Ag—Pd alloy material finds wide applications.

Although the migration is suppressed by adding Pd, the bonding between the electrode material and the ceramic material is not sufficient and, to cope with this problem, various measures have been taken as disclosed in Japanese Unexamined Patent Publications Nos. 5-304043 and 8-255509. Also, in spite of the fact that the migration is suppressed by adding Pd, the resultant higher cost poses a problem for industrial applications.

For these reasons, an integrally fired, laminated electromechanical transducing element is required which uses an inexpensive electrode material having the electrode characteristic at least equivalent to those of the Ag—Pd alloy material.

SUMMARY OF THE INVENTION (I) The present invention has been achieved in view of the problems of the prior art described above, and the object of the invention is to provide an integrally fired, laminated electromechanical transducing element employing an inexpensive electrode material having an electrode characteristic at least equivalent to an Ag—Pd electrode or, in particular, an integrally fired, laminated electromechanical transducing element having a low rigidity of the internal electrode layers with only a small internal stress generated at the time of elongation or contraction of the ceramic layers (subject A).

According to a first aspect of the invention, there is provided an integrally fired, laminated electromechanical transducing element comprising an integrally fired laminate member including a plurality of ceramic layers of piezoelectric ceramics or electrostrictive ceramics and internal electrode layers interposed between the ceramic layers, wherein the main component of the internal electrode layers is a base metal having a rigidity not more than 160 GPa.

What should be noted in this invention is the use of a base metal having a specific property, i.e. a rigidity not more than 160 GPa as a main component of the internal electrode layers. As a result, the rigidity of the internal electrode layers, as a whole, of the integrally fired, laminated electromechanical transducing element can be reduced, which in turn can reduce the internal stress generated by the elongation or contraction of the ceramic layers when driving the integrally fired, laminated electromechanical transducing element. Further, the fact that the main component of the internal electrode layers is a base metal can reduce the cost as compared with the conventional Ag—Pd material.

In the case where the Vickers hardness Hv exceeds 50 or the rigidity exceeds 160 GPa, the rigidity of the internal electrode layers as a whole increases and so does the internal stress at the time of elongation or contraction. This is liable to induce cracking or the like.

Specifically, a laminated actuator has such a characteristic that an assumed distortion X longitudinal to the direction of lamination is accompanied by a simultaneous transverse distortion of about one third, thereby generating a shearing stress between the internal electrode layers and the ceramic layers. Thus, the electrode material is required to have a low rigidity. The rigidity, though not definitely known, of the pure alloy composed of Ag and 30% Pd (hereinafter referred to as "Ag—Pd 30%") used as a conventional electrode material is estimated at about 160 GPa, a figure obtained as the product of 100.5 GPa (see Table 3), i.e. the rigidity of the pure metal Ag and 1.6, i.e. the hardness ratio of the Ag—Pd 30% alloy to the Ag annealed at 500° C. For preventing the adverse effect on the displacement performance and reliability of the actuator, the rigidity of the pure metal is required to be not more than 160 GPa, in which case the internal stress is estimated to be not higher than that of the Ag—Pd 30% alloy.

In the case where the rigidity of the pure metal is not more than 160 GPa, the internal stress is estimated at not more than equivalent to that of the pure metal Ag—Pd 30%. The base metals corresponding to this pure metal include Al, Cu, etc. Especially, Cu is desirable, as described later, as it has a volume resistivity as small as 1.7 $\mu\Omega$cm and a melting point of 1,083° C. which is higher than and approximate to the sintering temperature 900 to 1,050° C. of ceramics (refer to the ninth embodiment, described later).

According to a second aspect of the invention, there is provided an integrally fired, laminated electromechanical transducing element of which the displacement can be set to 0.06 to 0.15% when driven.

Specifically, the larger the displacement, the greater the internal stress of the electromechanical transducing element, resulting in a higher tendency to develop cracking.

Even in the case where the displacement is as high as 0.06% or more, however, the use of the specific base metal described above can suppress the internal stress and thus prevent the cracking.

The displacement of 0.15% or more reduces the strength of the ceramic layers themselves due to the repeated fatigue without regard to the electrodes, thereby undesirably shortening the service life thereof.

According to a third aspect of the invention, there is provided an integrally fired, laminated electromechanical transducing element in which the average thickness of the electrode layers is desirably 1 to 8 $\mu$m.

In the case where the average thickness of the electrode layers exceeds 8 $\mu$m, the rigidity of the internal electrode layers increases for a greater internal stress when the element is driven. The average thickness of less than 1 $\mu$m, on the other hand, undesirably both increases the resistance value of the electrodes and causes greater variations in the fabrication process.

According to a fourth aspect of the invention, there is provided an integrally fired, laminated electromechanical transducing element in which the electrode forming ratio, i.e. the ratio which the portion formed with the electrodes represents of the total length of the internal electrodes exposed to the cutting section along the direction of lamination of the laminated member can be set to not less than 75%. The higher the electrode forming ratio, the greater the tendency of the rigidity of the internal electrode layers as a whole to increase. According to this invention, as described above, the inherent rigidity of the internal electrode layers can be reduced for a smaller effect of a rigidity increase due to a higher electrode forming ratio. Conversely, it is possible to reduce the electric resistance.

According to a fifth aspect of the invention, there is provided an integrally fired, laminated electromechanical transducing element in which the main component of the electrode layers is desirably Cu, a Cu alloy or an oxide thereof comparatively low in cost. These materials also substantially meet the requirement of a base metal having a rigidity not more than 160 GPa (Table 3).

According to a sixth aspect of the invention, there is provided an integrally fired, laminated electromechanical transducing element in which the electrode layers preferably contain at least selected one of Ca, Mg and Sr as a material.

Specifically, the electromechanical transducing element according to this invention, being of integrally fired laminate type, is fabricated by integrally firing a laminate member composed of an alternate arrangement of green sheets for forming ceramic layers and an electrode paste material for forming the electrode layers. Preferably, the electrode paste material contains Cu or the like as a main component of the electrode layers on the one hand and at least one of Ca, Mg and Sr on the other. In such a case, as described above, the electrode layers obtained by integral firing contain at least one of Ca, Mg and Sr.

The fact that the electrode paste material has a component containing at least one of Ca, Mg and Sr contributes to the following-described superior functions and effects for integral firing.

Specifically, in the presence of a component such as CaO, MgO or SrO containing at least one of Ca, Mg and Sr in the electrode paste material, the laminate member composed of the green sheets and the electrode paste material can be fired while at the same time preventing or suppressing the fusion of a mixture of Cu and the green sheets or increasing the melting point of the mixture. As a result, the segregation of the molten material containing Cu flowing into the ceramic layers can be suppressed, and therefore the ceramic layers are fired into a form which can exhibit the original superior performance thereof sufficiently.

According to a seventh aspect of the invention, there is provided an integrally fired, laminated electromechanical transducing element in which the ceramic layers are preferably formed of PZT which is an oxide mainly having a perovskite structure of $Pb(Zr, Ti)O_3$. This PZT exhibits very superior characteristics for the ceramic layers for the electromechanical transducing element.

According to an eighth aspect of the invention, there is provided an integrally fired, laminated electromechanical transducing element in which the PZT preferably contains at least one of Mo and W. As a result, the sintering temperature of PZT can be reduced to facilitate the simultaneous firing with Cu.

According to a ninth aspect of the invention, there is provided an integrally fired, laminated electromechanical transducing element which can be used of for one of an actuator, a piezoelectric transducer and an ultrasonic motor. The cost of these products can thus be reduced and an improved performance obtained.

According to a tenth aspect of the invention, there is provided an integrally fired, laminated electromechanical transducing element which can be used for a fuel injection actuator for the injector. Specifically, the fuel injection actuator is required to be low in cost, high in responsiveness, high in durability and high in reliability, and these requirements can be met by the electromechanical transducing element described above.

(II) Further, the present invention is intended to provide an integrally fired, laminated electromechanical transducing element formed of an inexpensive electrode material having an electrode characteristic at least equivalent to that of the Ag—Pd electrode, or in particular an integrally fired, laminated electromechanical transducing element having a superior antimigration characteristic (subject B).

According to an 11th aspect of the invention, there is provided an integrally fired, laminated electromechanical transducing element fabricated by integrally firing a laminate member including a plurality of ceramic layers of the piezoelectric ceramics or the electrostrictive ceramics and internal electrode layers interposed between the ceramic layers, in which the internal electrode layers contain, as a main component thereof, a metal of which an oxide is stable in the atmosphere, and in which the value (A+B)×C is not more than $-34,000$ $(kJ/mol)^2$, where A (kJ/mol) is the ionization potential per mol of the metal, B (kJ/mol) the thermal energy of evaporation and C (kJ/mol) the oxide formation energy of the metal.

What should be noted about this invention is the fact that the metal contained in the electrode layers is a metal of a value (A+B)×C not more than $-34,000$ $(kJ/mol)^2$, in which A is the ionization potential per mol of the metal, B the energy of formation, and and C the oxide formation energy of the metal.

As a result, it is possible to fabricate an integrally fired, laminated electromechanical transducing element having a superior antimigration characteristic and a high durability.

For the property values and the antimigration characteristic of the metal material, refer to "Proceeding 31st. ECC (1981), pp.287–292" describing the fact that the ionization potential and the thermal energy of evaporation are related to the antimigration characteristic. On the other hand, "OMRON TECHNICS, Vol. 19, No. 4, pp.231–292," contains the description to the effect that the smaller the oxide generating energy, the superior the antimigration characteristic. Nevertheless, the truth has yet to be clarified theoretically due to the availability of very few related reports. It is common practice, therefore, to evaluate the antimigration characteristic by a water drop test or a similar experiment.

In view of this, the present inventors have come to realize that the migration requires that a metal, or a very small amount of a coexistent oxide of the metal, are ionized and jump out of the crystal lattices and that the metal ions remain without being oxidized at the same time. The inventors have also discovered that an antimigration constant Rm, defined as the sum of the ionization potential per mol of the metal and the thermal energy of evaporation, multiplied by the oxide generating energy, is negatively correlated with the antimigration characteristic (the time before the migration occurs) obtained by the water drop test. This relation, however, does not apply to the elements such as Au having a positive value of the oxide formation energy, i.e. the elements of which an oxide is very difficult to generate.

The property values of the conventionally used electrode material of Ag—Pd 30% are not known. However, the antimigration constant Rm, if considered as an arithmetic mean of the atomic % of Ag and Pd, is about −34,000. In the case where Rm is smaller than −34,000, the antimigration characteristic is estimated to be at least equivalent to that of Ag—Pd 30%. The corresponding base metals include Cu, Ni, Al, Mo and W. (refer to the ninth embodiment). Especially, the metal Cu is preferable as it has a volume resistivity as small as 1.7 $\mu\Omega m$ (refer to the ninth embodiment) and a melting point of 1,083° C. and higher than and approximate to the sintering temperature 900 to 1,050° C. of ceramic.

According to a 12th aspect of the invention, there is provided an integrally fired, laminated electromechanical transducing element in which the volume resistivity of the metal contained in the internal electrode layers is preferably not more than 15 $\mu\Omega cm$. This can reduce the electrical resistance value of the internal electrode layers for improved characteristics of the electromechanical transducing element.

According to a 13th aspect of the invention, there is provided an integrally fired, laminated electromechanical transducing element in which at least a part of the internal electrode layers is exposed to the side of the laminate member. Generally, the migration is facilitated by the exposure of the internal electrode layers. Nevertheless, according to the invention, the superior antimigration characteristic described above can be exhibited.

According to a 14th aspect of the invention, there is provided an integrally fired, laminated electromechanical transducing element in which the main component of the electrode layers is preferably Cu, a Cu alloy or an oxide thereof. The materials including Cu, a Cu alloy and an oxide thereof are comparatively low in cost and can easily achieve the value of (A+B)×C of not more than −34,000 (kJ/mol)$^2$. As a result, an integrally fired, laminated electromechanical transducing element can be obtained which is inexpensive and superior in antimigration characteristic. Also, Cu, a Cu alloy or an oxide thereof has a low electrical resistance (refer to the ninth embodiment), and can improve the bonding strength between the electrode layers and the ceramic layers even with an increased electrode forming ratio of the electrode layers.

According to a 15th aspect of the invention, there is provided an integrally fired, laminated electromechanical transducing element in which the electrode layers preferably contain at least selected one of Ca, Mg and Sr.

Specifically, the electromechanical transducing element according to the invention, being of integrally fired laminate type, is fabricated by integrally firing a laminate member constituted of an alternate arrangement of green sheets for forming the ceramic layers and the electrode paste material for forming the electrode layers. The electrode paste material preferably contains, as a main component of the electrode layers, Cu or the like on the one hand and a component having at least one of Ca, Mg and Sr on the other hand. In this case, as described above, the electrode layers obtained after the integral firing process contain at least one of Ca, Mg and Sr.

The fact that the electrode paste material contains at least selected one of Ca, Mg and Sr can lead to the superior functions and effects described below at the time of integral firing.

Specifically, as long as a component such as CaO, MgO or SrO containing at least one of Ca, Mg and Sr exists in the electrode paste material, the fusion of the mixture of Cu and the ceramic material can be prevented or suppressed or the melting point of the particular mixture can be increased at the time of integrally firing the laminate member composed of the green sheets and the electrode paste material. As a result, the segregation caused by the molten object containing Cu flowing into the ceramic layers can be suppressed. Thus, the resultant fired ceramic layers can sufficiently exhibit the originally superior performance thereof.

According to a 16th aspect of the invention, there is provided an integrally fired, laminated electromechanical transducing element in which the ceramic layers are preferably composed of PZT constituting an oxide having a perovskite structure mainly of Pb(Zr, Ti)O$_3$. This PZT exhibits a superior characteristic of the ceramic layers of the electromechanical transducing element.

According to a 17th aspect of the invention, there is provided an integrally fired, laminated electromechanical transducing element in which the PZT preferably contains at least one of Mo and W. This reduces the sintering temperature of PZT and facilitates sintering simultaneous with Cu.

According to an 18th aspect of the invention, there is provided an integrally fired, laminated electromechanical transducing element usable for an actuator, a piezoelectric transducer or an ultrasonic motor. This can reduce the product cost and improve the performance of the product.

According to a 19th aspect of the invention, there is provided an integrally fired, laminated electromechanical transducing element usable for a fuel injection actuator of the injector. Specifically, the fuel injection actuator is required to be low in cost, high in responsiveness, high in durability and high in reliability. These requirements can be met by use of the electromechanical transducing element described above.

(III) Further, the invention is intended to provide an integrally fired, laminated electromechanical transducing element made of an inexpensive electrode material having the electrode characteristic at least equivalent to that of the Ag—Pd electrode or, in particular, an integrally fired, laminated electromechanical transducing element having a low electrical resistance, a low loss of the injected charge, a high heat conductivity and a superior heat radiation characteristic (subject C).

According to a 20th aspect of the invention, there is provided an integrally fired, laminated electromechanical transducing element fabricated by integrally firing a laminate member including a plurality of ceramic layers of piezoelectric ceramics or electrostrictive ceramics and internal electrode layers interposed between the ceramic layers, in which the internal electrode layers contain, as a main component thereof, a base metal having the volume resistivity of not more than 15 $\mu\Omega$cm and the heat conductivity of not less than 50 W/mK.

What should be noted about this invention is that a base metal having such characteristics as the volume resistivity of not more than 15 $\mu\Omega$cm and the heat conductivity of not less than 50 W/mK is used as a main component of the internal electrode layers. As a result, the internal electrode layers having a low electrical resistance and a superior heat radiation characteristic can be obtained. Thus, the energy loss in the electrode layers can be reduced for improved characteristics of the electromechanical transducing element.

According to a 21st aspect of the invention, there is provided an integrally fired, laminated electromechanical transducing element in which the volume of the laminate member can be not less than 500 mm$^3$. In this integrally fired, laminated electromechanical transducing element, the larger the volume of the laminate member, the higher the tendency for the heat radiation characteristic to decrease. A large laminate member having a volume of 500 mm$^3$ or more is liable to pose the problem of a reduced heat radiation ability. The integrally fired, laminated electromechanical transducing element according to this aspect, however, contains a base metal having a specific volume resistivity and a specific heat conductivity as a main component, and therefore a sufficient heat radiation characteristic can be secured.

According to a 22nd aspect of the invention, there is provided an integrally fired, laminated electromechanical transducing element in which the sectional area of the laminate member can be not less than 18 mm$^2$. In this integrally fired, laminated electromechanical transducing element, the larger the sectional area of the laminate member, the easier for the heat radiation ability to decrease. Especially for a large laminate member having a sectional area of 18 mm$^2$ or more, the reduction in the heat radiation characteristic often poses a problem. The integrally fired, laminated electromechanical transducing element according to the invention, however, contains as a main component a base metal having a specific volume resistivity and a specific heat conductivity as described above and therefore can secure a sufficient heat radiation ability.

According to a 23rd aspect of the invention, there is provided an integrally fired, laminated electromechanical transducing element which can be used with an injection energy of 0.025 to 0.075 mJ/mm$^3$ at the time of driving.

In this integrally fired, laminated electromechanical transducing element, the larger the injection energy for driving, the easier for the heat radiation ability to decrease. Especially in the case where the injection energy per unit volume in the driving process is not less than 0.025 mJ/mm$^3$, the reduction in the heat radiation characteristic is often a problem.

Nevertheless, the integrally fired, laminated electromechanical transducing element according to the invention, containing a base metal having a specific volume resistivity and a specific heat conductivity as a main component, can secure a sufficient heat radiation ability. In view of the fact that the injection energy of more than 0.075 mJ/mm$^3$ causes the heat generation of the element to exceed the heat radiation by the electrodes considerably, however, the ceramic is thermally degenerated undesirably for an actuator.

According to a 24th aspect of the invention, there is provided an integrally fired, laminated electromechanical transducing element in which the average value of the thickness of the electrode layers is preferably not less than 1 $\mu$m. In the case where the average thickness of the electrode layers is less than 1 $\mu$m, both the conductivity and the heat radiation ability decrease, thereby posing the problem of an increased energy loss in the electrode layers and an increased temperature of the element.

According to a 25th aspect of the invention, there is provided an integrally fired, laminated electromechanical transducing element in which the electrode forming ratio, i.e. the ratio which the portion formed with the electrodes represents of the whole length of the internal electrodes exposed to the section cut along the direction of lamination of the laminate member is preferably not less than 75%. This can further reduce the electrical resistance of the electrode layers and further improve the heat radiation characteristic.

According to a 26th aspect of the invention, there is provided an integrally fired, laminated electromechanical transducing element in which the main component of the electrode layers is preferably Cu, a Cu alloy or an oxide thereof. The materials including Cu, a Cu alloy and an oxide thereof are comparatively inexpensive and at the same time can positively meet the requirements of a base metal having specific characteristics such as a volume resistivity of not more than 15 $\mu\Omega$cm and a heat conductivity of not less than 50 W/mK (refer to the ninth embodiment).

According to a 27th aspect of the invention, there is provided an integrally fired, laminated electromechanical transducing element in which the electrode layers preferably contain at least one of Ca, Mg and Sr.

Specifically, the electromechanical transducing element according to this invention is of an integrally fired laminate type, and is therefore fabricated by integrally firing a laminate member formed of an alternate arrangement of the green sheets for forming the ceramic layers and the electrode paste material for forming the electrode layers. The electrode paste material preferably contains, as a main component of the electrode layers, Cu or the like on the one hand and a component having at least one of Ca, Mg and Sr on the other hand. In such a case, as described above, the electrode layers obtained after the integral firing process contain at least selected one of Ca, Mg and Sr.

The fact that the electrode paste material includes a component containing at least one of Ca, Mg and Sr as described above produces the following-described superior functions and effects in the integral firing process.

Specifically, in the presence of a component such as CaO, MgO or SrO containing at least one of Ca, Mg and Sr in the electrode paste material, the laminate member composed of the green sheets and the electrode paste material can be integrally fired while preventing or suppressing the fusion of the mixture of Cu and the ceramic material or increasing the melting point of the mixture. As a result, the segregation can be suppressed which otherwise might be caused by the molten material containing Cu flowing into the ceramic layers. In this way, the ceramic layers obtained can sufficiently exhibit the inherently superior performance thereof.

According to a 28th aspect of the invention, there is provided an integrally fired, laminated electromechanical transducing element in which the ceramic layers preferably are formed of PZT, i.e. an oxide mainly having the perovskite structure of Pb(Zr, Ti)O$_3$. This PZT exhibits a highly superior characteristic as the ceramic layers for the electromechanical transducing element.

According to a 29th aspect of the invention, there is provided an integrally fired, laminated electromechanical transducing element in which the PZT preferably contains at least one of Mo and W. This reduces the sintering temperature of PZT while at the same time facilitating the simultaneous firing with Cu.

According to a 30th aspect of the invention, there is provided an integrally fired, laminated electromechanical transducing element which can be used for selected one of an actuator, a piezoelectric transducer and an ultrasonic motor. These products can thus be reduced in cost and improved in performance.

According to a 31st aspect of the invention, there is provided an integrally fired, laminated electromechanical transducing element which can be used for a fuel injection actuator of the injector. Specifically, the fuel injection actuator is required to be low in cost, high in responsiveness, high in durability and high in reliability. These requirements can be met by use of the electromechanical transducing element described above.

(IV) Further, the present invention is intended to provide an integrally fired, laminated electromechanical transducing element having the electrode characteristic at least equivalent to that of the Ag—Pd electrode by employing an inexpensive electrode material, or in particular to an integrally fired, laminated electromechanical transducing element having a superior bonding strength between the ceramic layers and the electrode layers (subject D).

According to a 32nd aspect of the invention, there is provided an integrally fired, laminated electromechanical transducing element fabricated by integrally firing a laminate member composed of a plurality of ceramic layers of piezoelectric ceramics or electrostrictive ceramics and internal electrode layers interposed between the ceramic layers, wherein the electrode forming ratio, i.e. the ratio which the portion formed with the electrodes represents of the total length of the internal electrodes exposed to the section cut along the direction of lamination of the laminated member is not less than 75%, and wherein the bonding strength between the internal electrodes and the ceramic layers is not less than 40 MPa.

What should be noted about this invention is that the electrode forming ratio is set to a value as high as not less than 75% and the bonding strength to not less than 40 MPa. As a result, an integrally fired, laminated electromechanical transducing element can be obtained which has a high bonding strength between the ceramic layers and the electrode layers and a superior electrode resistance.

The electrode forming ratio is a value calculated from the image obtained by observation under electron microscope or laser microscope of the laminate member mirror polished so as to expose the internal electrode layers in the section along the direction of lamination of the laminate member and represented by a value expressed as (B/A)×100%, where A is the total length and B the length of the whole electrode forming portion.

The bonding strength, on the other hand, is defined as a value obtained using, as a sample, a square metal plate having a side length of 3 to 10 mm and smaller than the laminate member which is attached to a hexagonal nut by an adhesive on each of the upper and lower surfaces of the laminate member, and a wire fixed in the holes of the hexagonal nuts is pulled at the rate of 0.5 to 2 mm per minute along the direction of lamination, so that the actual breaking load between the internal electrode layers and the ceramic layers is divided by the area of the metal plate.

In the case where the electrode forming ratio is less than 75%, the problem is posed that the electrical resistance of the electrode layers is increased considerably. Preferably, the electrode forming ratio is 100%. In the case where the bonding strength is less than 40 MPa, on the other hand, the problem is a reduced durability of the electromechanical transducing element In the case of the electromechanical transducing element according to the first embodiment, for example, an elongation of about 0.1% is caused along the direction of lamination by applying a voltage thereto. In the process, a tensile stress is generated in the neighborhood of the external electrode 31 shown in FIG. 1 along the direction of lamination in such a manner as to separate the internal electrode layers and the ceramic layers from each other, and cracking develops when this stress exceeds the bonding strength often resulting in shorting during operation.

The bonding strength required for preventing this cracking, as calculated by simulation, is 40 MPa.

According to a 33rd aspect of the invention, there is provided an integrally fired, laminated electromechanical transducing element in which the average thickness of the internal electrode layers is preferably not more than 8 μm. In the case where the average thickness exceeds 8 μm, the rigidity of the internal electrode layers so increases that the internal stress is increased during the driving operation.

According to a 34th aspect of the invention, there is provided an integrally fired, laminated electromechanical transducing element in which the main component of the electrode layers is preferably Cu, a Cu alloy or an oxide thereof. The material such as Cu, a Cu alloy or an oxide thereof is comparatively inexpensive, low in electrical resistance and readily meets the requirements of both the electrode forming ratio and the bonding strength described above.

Specifically, an example is a case in which the ceramic layers contains Pb as a component. In the case where the conventional Ag—Pd electrode is used, the bonding strength between the electrode material and the ceramic material is not sufficient. For securing a sufficient bonding strength, the portion where the upper and lower ceramic layers are bonded directly to each other without the intermediary of the electrodes is required to representing at least 25% of the whole, that is to say, the electrode forming ratio is required to be not more than about 75%. This reduced electrode forming ratio, however, poses the problem of an increased electrical resistance.

The use of Cu as an electrode material, on the other hand, can produce a high bonding strength while keeping a high electrode forming ratio as a compound is formed by Cu and Pb. As described above, therefore, the requirements for the electrode forming ratio of not less than 75% and the bonding strength of not less than 40 MPa can be readily met by forming the main component of the electrode layers of Cu, a Cu alloy or an oxide thereof.

According to a 35th aspect of the invention, there is provided an integrally fired, laminated electromechanical transducing element in which the electrode layers preferably contain at least selected one from Ca, Mg and Sr.

Specifically, the electromechanical transducing element according to the invention is of integrally fired laminate type, and therefore is fabricated by forming and integrally firing a laminate member including an alternate arrangement of green sheets for forming the ceramic layers and the electrode paste material for forming the electrode layers. In the process, the electrode paste material preferably contains, as a main component, Cu or the like on the one hand and a component including at least one of Ca, Mg and Sr on the other hand. In such a case, as described above, the electrode layers obtained by integral firing contain at least one of Ca, Mg and Sr.

The fact that the electrode paste material contains at least one of Ca, Mg and Sr leads to the following-described superior functions and effects in the integral firing process.

Specifically, in the presence of a component such as CaO, MgO or SrO containing at least one of Ca, Mg and Sr in the electrode paste material described above, the fusion of the mixture of Cu and the ceramic material can be prevented or suppressed or the melting point of the mixture can be increased when integrally firing the laminate member including the green sheets and the electrode paste material. As a result, the segregation or the like phenomenon which otherwise might be caused by the molten object containing Cu flowing into the ceramic layers can be suppressed. Thus, the ceramic layers can be fired into a state capable of fully exhibiting the inherently superior performance thereof.

According to a 36th aspect of the invention, there is provided an integrally fired, laminated electromechanical transducing element in which the ceramic layers are preferably composed of PZT which is mainly an oxide having the perovskite structure of $Pb(Zr, Ti)O_3$. This PZT exhibits a quite superior characteristic for the ceramic layers of the electromechanical transducing element.

According to a 37th aspect of the invention, there is provided an integrally fired, laminated electromechanical transducing element in which the PZT preferably contains at least one of Mo and W. As a result, the sintering temperature of the PZT can be reduced while at the same time facilitating the simultaneous firing with Cu.

According to a 38th aspect of the invention, there is provided an integrally fired, laminated electromechanical transducing element which can be used for an actuator, a piezoelectric transducer or an ultrasonic motor. These products can thus be produced at a lower cost with an improved performance.

According to a 39th aspect of the invention, there is provided an integrally fired, laminated electromechanical transducing element which can be used for a fuel injection actuator for the injector. Specifically, a low cost, a high responsiveness, a high durability and a high reliability required of the fuel injection actuator can be achieved by employing the electromechanical transducing element described above.

DESCRIPTION OF THE PREFERRED EMBODIMENTS (First Embodiment)

An integrally fired, laminated electromechanical transducing element according to an embodiment of the invention will be explained with reference to FIGS. 1 and 2.

Figure 1:
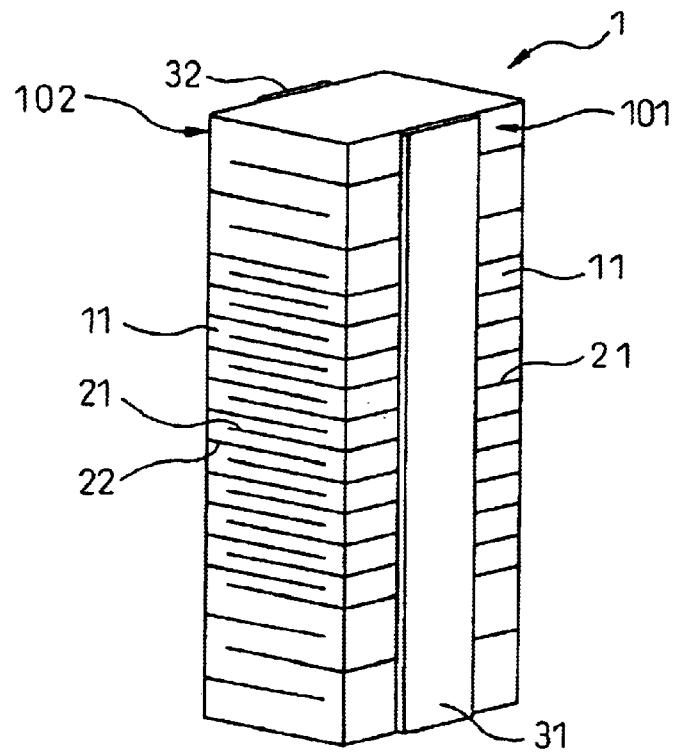
FIG. 1 is a perspective view showing an integrally fired, laminated electromechanical transducing element according to a first embodiment of the invention.

This embodiment concerns, as shown in FIG. 1, an integrally fired, laminated electromechanical transducing element comprising a laminate member 10 composed of a plurality of ceramic layers 11 of PZT and internal electrode layers 21, 22 interposed between the ceramic layers 11.

First, in order to obtain green sheets for fabricating the ceramic layers, the PZT raw material in powder form is prepared which has the chemical composition adjusted as $(Pb_{0.92}Sr_{0.09})\{(Zr_{0.54}Ti_{0.46})_{0.985}(Y_{0.5}Nb_{0.5})_{0.01}Mn_{0.005}\}O_3$+ 0.5 mol % $Pb_{0.83}W_{0.17}Ox$. Then, polyvinyl alcohol, BBP, an organic solvent and a dispersant are added to the powdered PZT raw material and mixed and kneaded for 48 hours in the bowl mill, after which green sheets 110 μm thick are fabricated by the doctor blade method.

The electrode paste material is fabricated by mixing and kneading 35 wt % of an organic vehicle composed of ethylcellulose dissolved with terpineol and a resin material (acrylic resin, arachidonic resin, ethocell resin, etc.) and 65 wt % of CuO powder (average particle size: 0.2 to 0.5 μm).

The green sheets thus recovered are punched in press or cut by cutter to form a rectangular member of a predetermined size.

Figure 2:
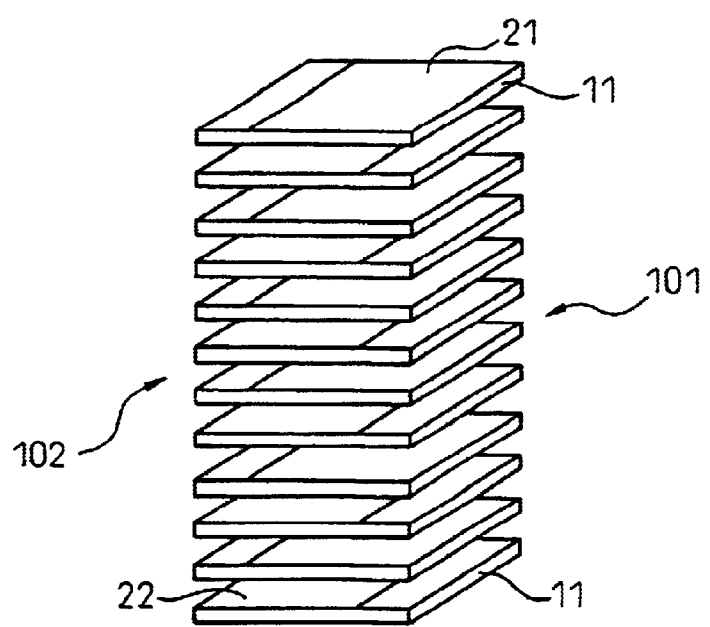
FIG. 2 is a perspective development showing the lamination of the ceramic layers and the internal electrode layers according to the first embodiment of the invention.

As shown in FIG. 2, one surface of the green sheets 11 thus formed is coated with the electrode paste material by screen printing. In this embodiment, the printing thickness is set to 15 μm.

As shown in FIG. 2, about 200 green sheets 11 are stacked. In the process, the electrode paste materials 21, 22 are arranged to reach the right and left side surfaces 101, 102 (FIGS. 1 and 2) alternately. After bonding these sheets under pressure, the resultant laminate member is cut into a predetermined size.

After degreasing the laminate member in the atmosphere, the metalizing process is carried out.

In the metalizing process, CuO contained in the electrode paste material is reduced to Cu in the reducing environment of a comparative low temperature. In this embodiment, the ceramic material, which is an oxide at least containing lead according to the chemical formula, is reduced by adjusting the environment at a temperature just below the eutectic point 326° C. of lead and copper.

The firing process for firing the laminate member integrally is carried out. In this embodiment, the firing is conducted at the temperature of 965° C. while adjusting the oxygen partial pressure to $10^{-6}$ atm.

The sintered member thus obtained is ground to the sizes of 7×7×20 mm, 5×5×20 mm and 4.2×4.2×30 mm, and then after printing the side electrodes 31, 32 as shown in FIG. 1, lead wires (not shown) are mounted. Then, a voltage of 150 V is applied for 30 minutes at 130° C. in the silicon oil for polarization thereby to fabricate an integrally fired, laminated electromechanical transducing element 1. This is called an element E1 according to the invention.

The various performances of the integrally fired, laminated electromechanical transducing element 1 according this embodiment (the element E1 according to the invention) are measured. The element E1 according to the invention is found to have a thickness 90 μm of the ceramic layers, a thickness 4.5 μm of the electrode layers and the electrode forming ratio of 98%.

Under the imposed load of 10 MPa and the applied voltage of 150 V, the static displacement is 1 μm/mm, which is a superior characteristic for an actuator.

According to this embodiment, an integrally fired, laminated electromechanical transducing element having the same dimensions, the same layer thickness and the same film thickness as the element E1 according to the invention is fabricated as a comparison element (comparison element C1), using an electrode paste having the same PZT composition and electrode paste of Ag—Pd 30%. The resistance value of the element E1 according to the invention and that of the comparison element C1 are compared with each other. The comparison element C1 has an electrode forming ratio of 97%.

Comparison shows that the resistance value of each electrode layer is 0.15 Ω for the comparison element C1 of Ag—Pd 30% and 0.06 Ω for the Cu electrode of the element E1 according to the invention.

According to this embodiment, the stress calculation is conducted while applying a DC voltage of 150 V using, as models, the element E1 according to the first embodiment of the invention (Cu electrode) having the dimensions of 7×7×20 mm and an integrally fired, laminated electromechanical transducing element constituting the comparison element C1 (Ag—Pd 30% electrode). The actual measurement of longitudinal displacement is 0.08%. The rigidity used for the calculation is 70 GPa for ceramics, 160 GPa for the Ag—Pd 30% electrode and 136 GPa for the Cu electrode, and a Poisson number of 0.3 for both the ceramics and the electrodes.

As a result, it has been found that the comparison element C1 (Ag—Pd 30% electrode) develops an internal stress (tensile stress) of 37 MPa and the element E1 according to the invention (Cu electrode) an internal stress of 31 MPa in the ceramic layers. The internal stress exceeds 40 MPa for the Cu electrode having a thickness of not less than 8 μÊm.

(Second Embodiment)

According to this embodiment, the heat radiation characteristic is measured by comparison using the element E1 according to the first embodiment of the invention and the comparison element C1.

The measurement is conducted by driving each electromechanical transducing element while changing the injection energy with a trapezoidal positive voltage waveform of 100 Hz for a rise period of 150 μs under the imposed load of 20 MPa and the applied voltage of 0 to 150 V. The displacement amount involved is 0.06%.

The result of the measurement is shown in Table 1.

The heat generation temperature is smaller in all cases for the Cu electrode of the element E1 according to the invention, and the heat generation is reduced for the volume of not less than 500 $mm^3$, the sectional area of not less than 18 $mm^2$ and the injection energy of 0.021 $mJ/mm^3$. This is considered due to the better heat radiation characteristic of the Cu electrode having a higher heat transfer coefficient.

TABLE 1

| Dimensions | Injection energy | Element E1 of invention (Cu electrode) | Comparison Element C1 (Ag-Pd 30% electrode) |
|---|---|---|---|
| 7 × 7 × 20 mm (Volume: 980 $mm^3$, Sectional area: 49 $mm^2$) | 39 mJ (0.041 $mJ/mm^3$) | 37° C. | 42° C. |
| 7 × 7 × 20 mm (Volume: 980 $mm^3$, Sectional area: 49 $mm^2$) | 25 mJ (0.026 $mJ/mm^3$) | 21° C. | 25° C. |
| 7 × 7 × 20 mm (Volume: 980 $mm^3$, Sectional area: 49 $mm^2$) | 25 mJ (0.021 $mJ/mm^3$) | 17° C. | 18° C. |
| 5 × 5 × 20 mm (Volume: 500 $mm^3$, Sectional area: 25 $mm^2$) | 20 mJ (0.04 $mJ/mm^3$) | 34° C. | 38° C. |
| 4.2 × 4.2 × 30 mm (Volume: 530 $mm^3$, Sectional area: 17.6 $mm^2$) | 21 mJ (0.04 $mJ/mm^3$) | 26° C. | 28° C. |

(Third Embodiment)

According to this embodiment, the antimigration characteristic is compared between the integrally fired, laminated electromechanical transducing element constituting the element E1 according to the invention (Cu electrode) having the dimensions of 7×7×20 mm and the integrally fired, laminated electromechanical transducing element constituting the comparison element C1 (Ag—Pd 30% electrode).

As shown in FIG. 1, each electromechanical transducing element has such a structure that the positive and negative electrodes are alternately exposed to the side surfaces not connected with the side electrodes 31, 32 and the surface of the electromechanical transducing element is not coated with any silicon grease making up a resin for securing the insulation. The time before shorting is evaluated for three each of these electromechanical transducing elements at room temperature in the environment of 40 to 50% in relative humidity with a DC voltage of 90 V applied thereto (field strength of 1 kV/mm).

As a result, the comparison elements C1 (Ag—Pd 30% electrode) are shorted within 25, 37 and 68 hours, respectively, while the element E1 according to the invention (Cu electrode) is not shorted even after 100 hours exhibiting a superior antimigration characteristic.

(Fourth Embodiment)

According to this embodiment, the bonding strength is measured using the integrally fired, laminated electromechanical transducing element constituting the element E1 according to the invention (Cu electrode) having the dimensions of 7×7×20 mm and the integrally fired, laminated electromechanical transducing element constituting the comparison element C1 (Ag—Pd 30% electrode). The electrode forming ratio of these elements is 98%.

Also, by way of comparison, an integrally fired, laminated electromechanical transducing element having the Ag—Pd 30% electrode with the electrode forming ratio of 75% as a comparison element C2 is prepared, and the bonding strength thereof is measured.

As a result, the bonding strength of the element E1 according to the invention (Cu electrode with the electrode forming ratio of 98%) is found to be 35 to 50 MPa, which the bonding strength of the comparison element C1 (the Ag—Pd 30% electrode with the electrode forming ratio of 98%) is found to be 15 to 30 MPa and the bonding strength of the comparison element C2 (the Ag—Pd 30% electrode with the electrode forming ratio of 75%) to be 25 to 40 MPa.

Thus, it has been confirmed that the element E1 according to the invention (Cu electrode) has a bonding strength of not less than 40 MPa with the electrode forming ratio of not less than 75%.

(Fifth Embodiment)

According to this embodiment, as shown in Table 2, nine types of samples (samples 1 to 9) are prepared as an electrode paste material and an electromechanical transducing element is prepared using these materials.

TABLE 2

| Sample No. | Organic vehicle and resin | CuO powder | Subtotal | Additive (wt %) |
|---|---|---|---|---|
| Sample 1 | 35.0 | 65.0 | 100.0 | CaO: 5 |
| Sample 2 | 35.0 | 65.0 | 100.0 | CaO: 10 |
| Sample 3 | 35.0 | 65.0 | 100.0 | CaO: 15 |
| Sample 4 | 35.0 | 65.0 | 100.0 | MgO: 5 |
| Sample 5 | 35.0 | 65.0 | 100.0 | MgO: 10 |
| Sample 6 | 35.0 | 65.0 | 100.0 | SrO: 10 |
| Sample 7 | 35.0 | 65.0 | 100.0 | Nil |
| Sample 8 | 35.0 | 65.0 | 100.0 | BaO: 5 |
| Sample 9 | 35.0 | 65.0 | 100.0 | Ti: 5 |

These electrode paste materials are prepared in the following manner.

Specifically, the CuO powder (average particle size: 0.2 to 0.5 $\mu$m) and an additive (one of CaO, MgO and SrO) are mixed and kneaded with a resin material (acrylic resin, arachidonic resin, ethocell resin, etc.) and an organic vehicle constituted of ethycellulose dissolved with terpineol in the ratio described in Table 2 thereby to prepare an electrode paste material. As a material for producing Cao, $CaCO_3$ is used, and as a material for producing SrO, $SrCO_3$ is used by conversion in terms of the molecular weight indicated in the chemical formulae (this also applies to CaO and SrO in the description below).

Using this CuO paste material, a laminate member is fabricated following the steps described below. According to this embodiment, however, the number of layers is three for conducting a test.

First, green sheets formed of a ceramic material are produced using the doctor blade method like in the first embodiment.

The surface of each green sheet is coated, as in the first embodiment, with each electrode paste material by screen printing. The thickness is set to 15 $\mu$m for printing.

Figure 3:
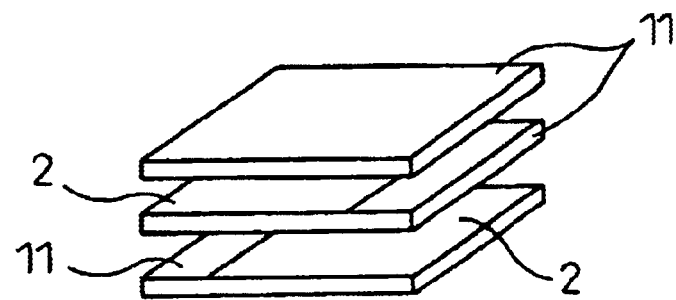
FIG. 3 is a perspective development showing the lamination of the ceramic layers and the internal electrode layers according to a fifth embodiment of the invention.

As shown in FIG. 3, a total of three green sheets including two green sheets 11 printed with the electrode paste material 2 and one green sheet not printed with the electrode paste material 2 are formed into a laminate, bonded under pressure and cut into a predetermined size.

After degreasing the resulting assembly in the atmosphere, the metalizing process is carried out to reduce the laminate on condition that the environment is adjusted at a temperature immediately below 326° C., as in the first embodiment. This is followed by the firing process. The firing temperature is varied with the density of the element material. According to this embodiment, the environment is adjusted in such a manner as not reduce the oxide of the element portion as far as possible without oxidizing Cu in the adjusted environment at 950° C. In this embodiment, the oxygen partial pressure is adjusted to about $10^{-4}$ at 950° C.

Figure 4:
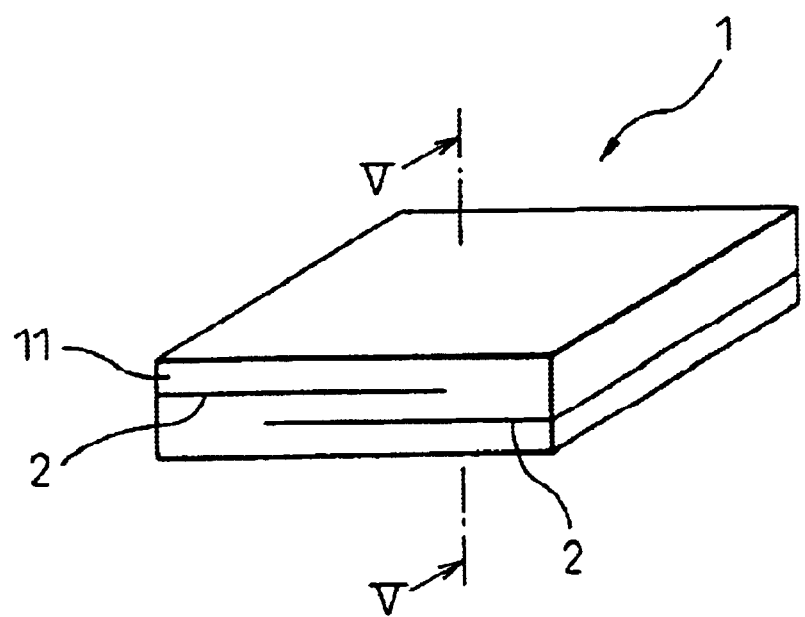
FIG. 4 is a perspective view showing an integrally fired, laminated electromechanical transducing element according to the fifth embodiment of the invention.
Figure 5:
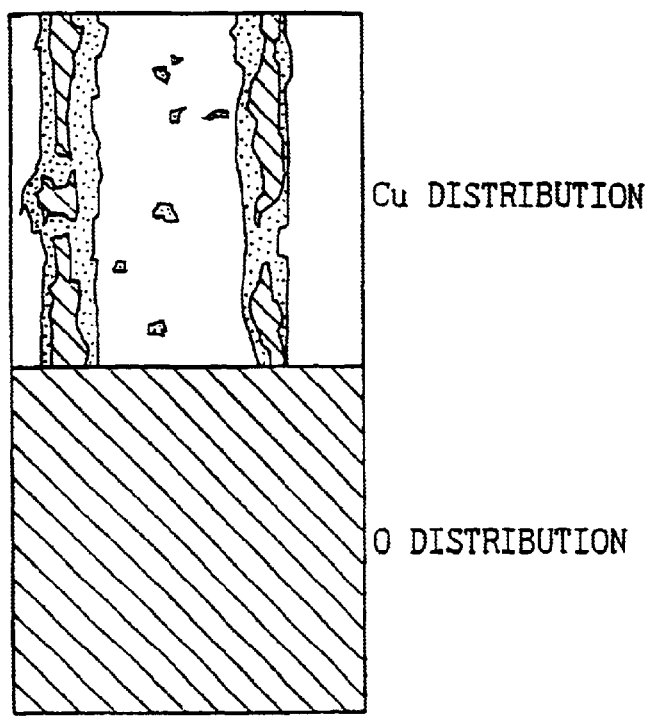
FIG. 5 is a diagram for explaining the distribution of Cu and O of sample 1 according to the fifth embodiment of the invention.
Figure 6:
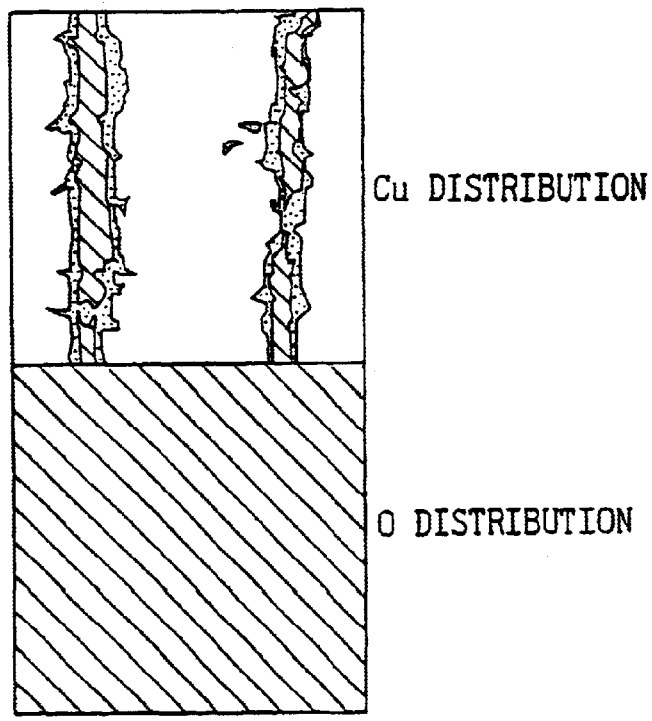
FIG. 6 is a diagram for explaining the distribution of Cu and O of sample 2 according to the fifth embodiment of the invention.
Figure 7:
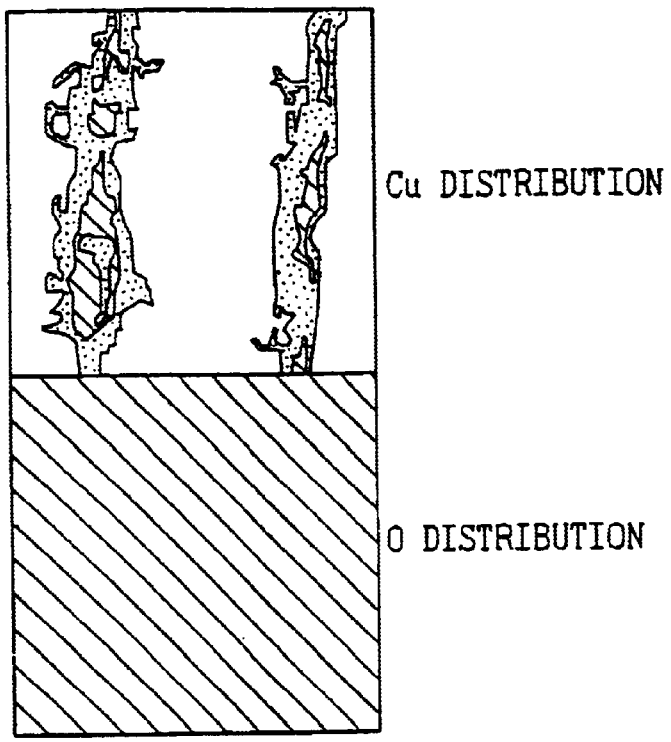
FIG. 7 is a diagram for explaining the distribution of Cu and O of sample 3 according to the fifth embodiment of the invention.
Figure 8:
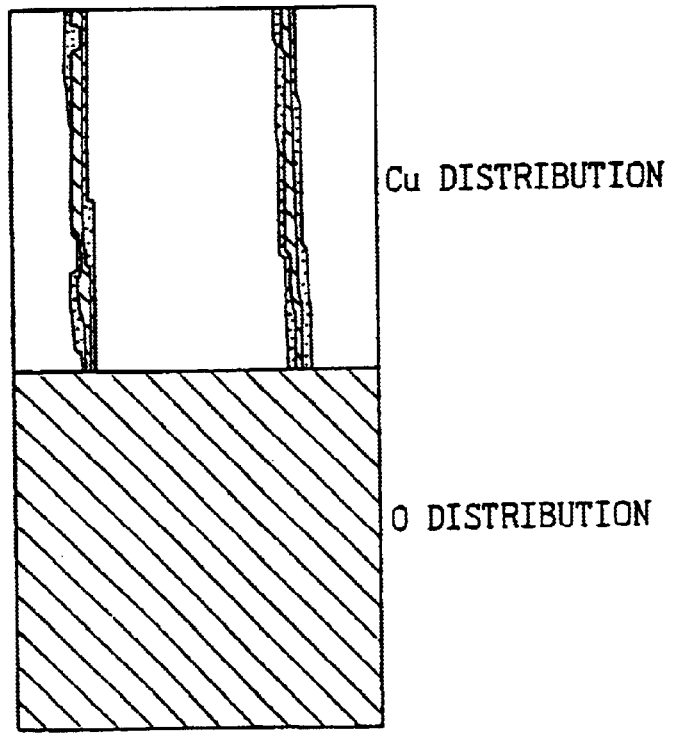
FIG. 8 is a diagram for explaining the distribution of Cu and O of sample 4 according to the fifth embodiment of the invention.
Figure 9:
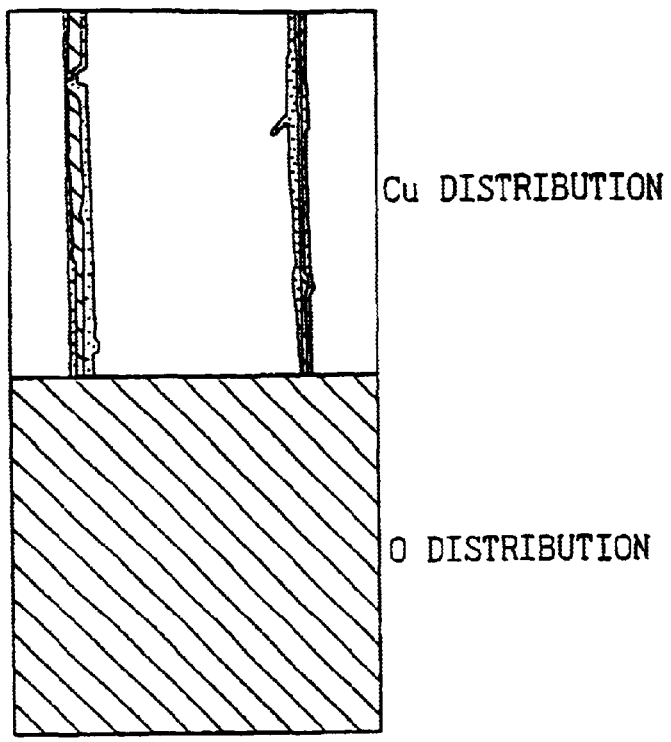
FIG. 9 is a diagram for explaining the distribution of Cu and O of sample 5 according to the fifth embodiment of the invention.
Figure 10:
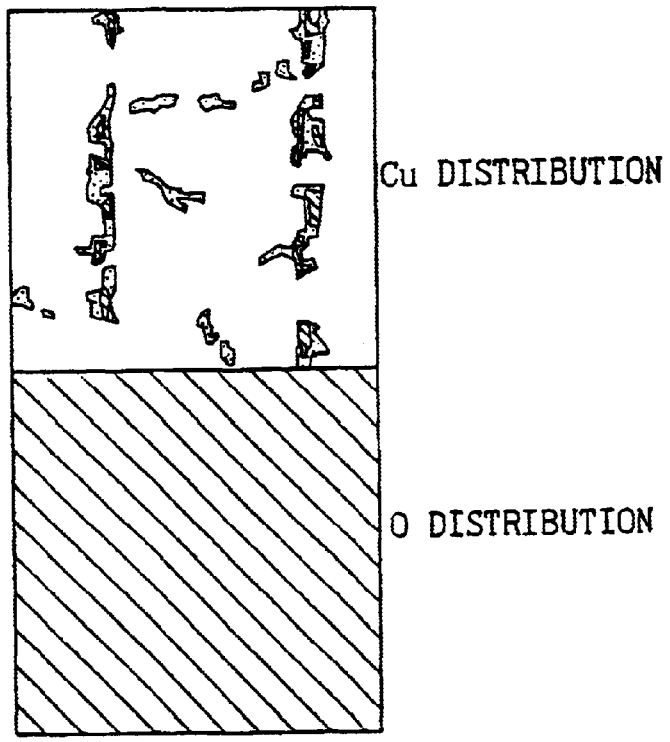
FIG. 10 is a diagram for explaining the distribution of Cu and O of sample 6 according to the fifth embodiment of the invention.

As shown in FIG. 4, the integrally fired, laminated electromechanical transducing element thus obtained is observed at the central portion of the section taken in line V—V indicated by arrow in FIG. 4.

For observing the cross section, the distribution of Cu and O in the section is measured using EPMA under the conditions of the acceleration voltage of 20 kV, the current of $1 \times 10^{-7}$ A, 256×256 pixels, 20 ms per pixel and the magnification of 700.

The result of observation is shown as a schematically plotted form in FIGS. 5 to 13. In these diagrams, the portion having a comparatively high concentration is hatched. In each drawing, the upper portion represents the Cu distribution and the lower portion the O distribution at the same position.

Figure 11:
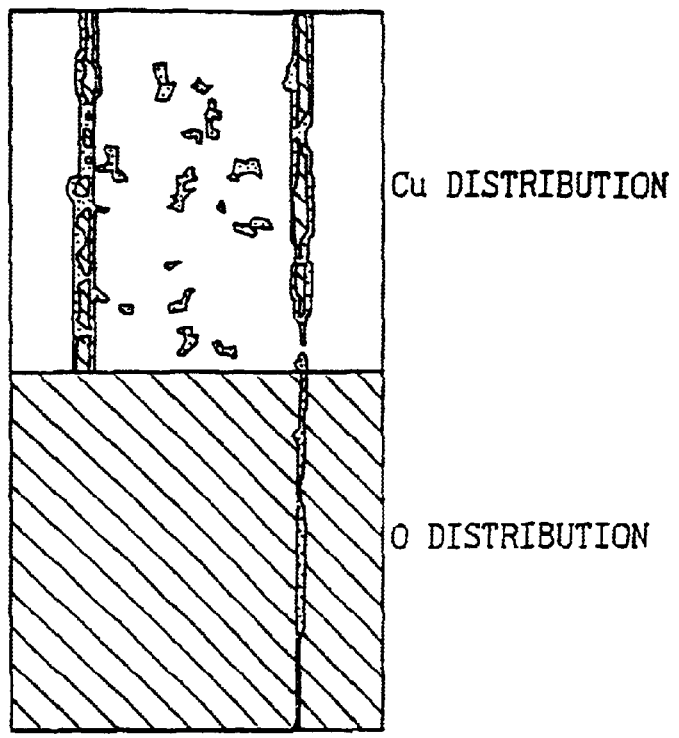
FIG. 11 is a diagram for explaining the distribution of Cu and O of sample 7 according to the fifth embodiment of the invention.
Figure 12:
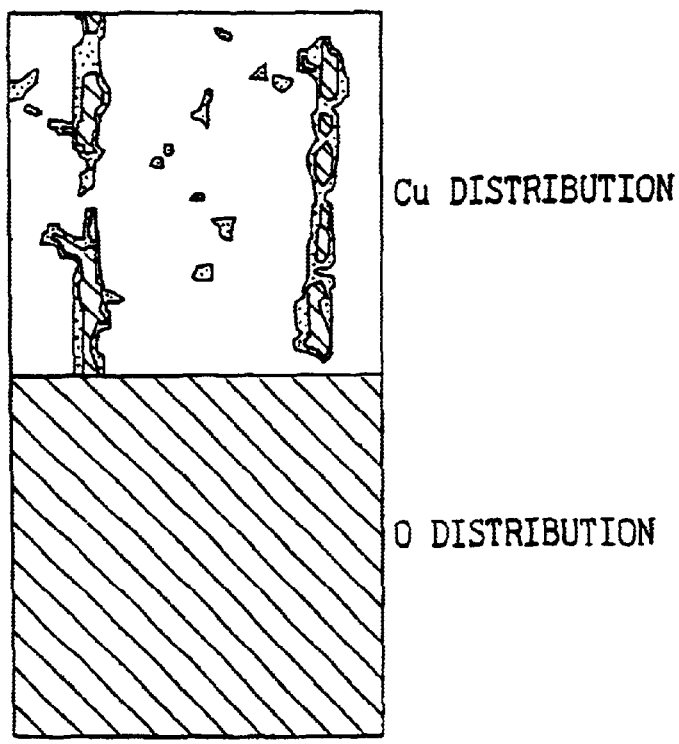
FIG. 12 is a diagram for explaining the distribution of Cu and O of sample 8 according to the fifth embodiment of the invention.
Figure 13:
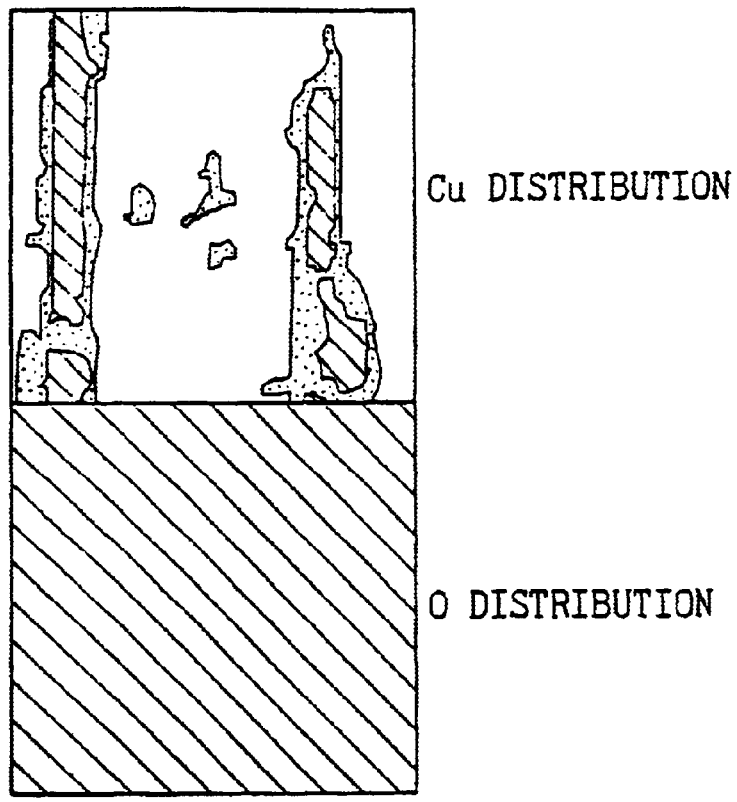
FIG. 13 is a diagram for explaining the distribution of Cu and O of sample 9 according to the fifth embodiment of the invention.

As seen from FIGS. 11 to 13, the samples 7 to 9 are accompanied by a considerable loss of the electrode layers and develop the segregation of Cu constituting a conductive base metal material in the ceramic layers. In the case of the samples 1 to 6, in contrast, as seen from FIGS. 5 to 10, no or little segregation of Cu is observed in the ceramic layers.

This indicates that the Cu segregation can be suppressed by adding CaO constituting a fusion suppression material or MgO or SrO constituting a material for increasing the melting point to the electrode paste material.

(Sixth Embodiment)

According to this embodiment, a three-layer laminate member is fabricated using the paste material constituted of the samples 1 to 3 and 7 in the fifth embodiment by following the same steps as in the fifth embodiment except for the oxygen partial pressure at 950° C. for firing.

The observation of the cross section of the resultant electromechanical transducing element shows that, as in the fifth embodiment, the segregation of the component element Cu in the transducing element can be suppressed as far as the laminate member fabricated of the paste material with CaO added thereto is concerned.

(Seventh Embodiment)

According to this embodiment, the oxygen partial pressure at 950° C. for firing is adjusted to about $10^{-6}$ atm in the sixth embodiment. As a result, even the laminate member fabricated of the paste material constituting the sample 7 is found to develop no segregation of the component element Cu.

As described above, it is seen that a laminate member formed continuously with electrodes and developing no segregation in the ceramic layers can be produced by controlling the composition of the CuO paste and the oxygen partial pressure for firing as in the fifth to seventh embodiments.

(Eighth Embodiment)

This embodiment concerns an example of the injector 5 in which an electromechanical transducing element having the same configuration as the integrally fired, laminated electromechanical transducing element 1 according to the first embodiment is used for the fuel injection actuator.

Figure 14:
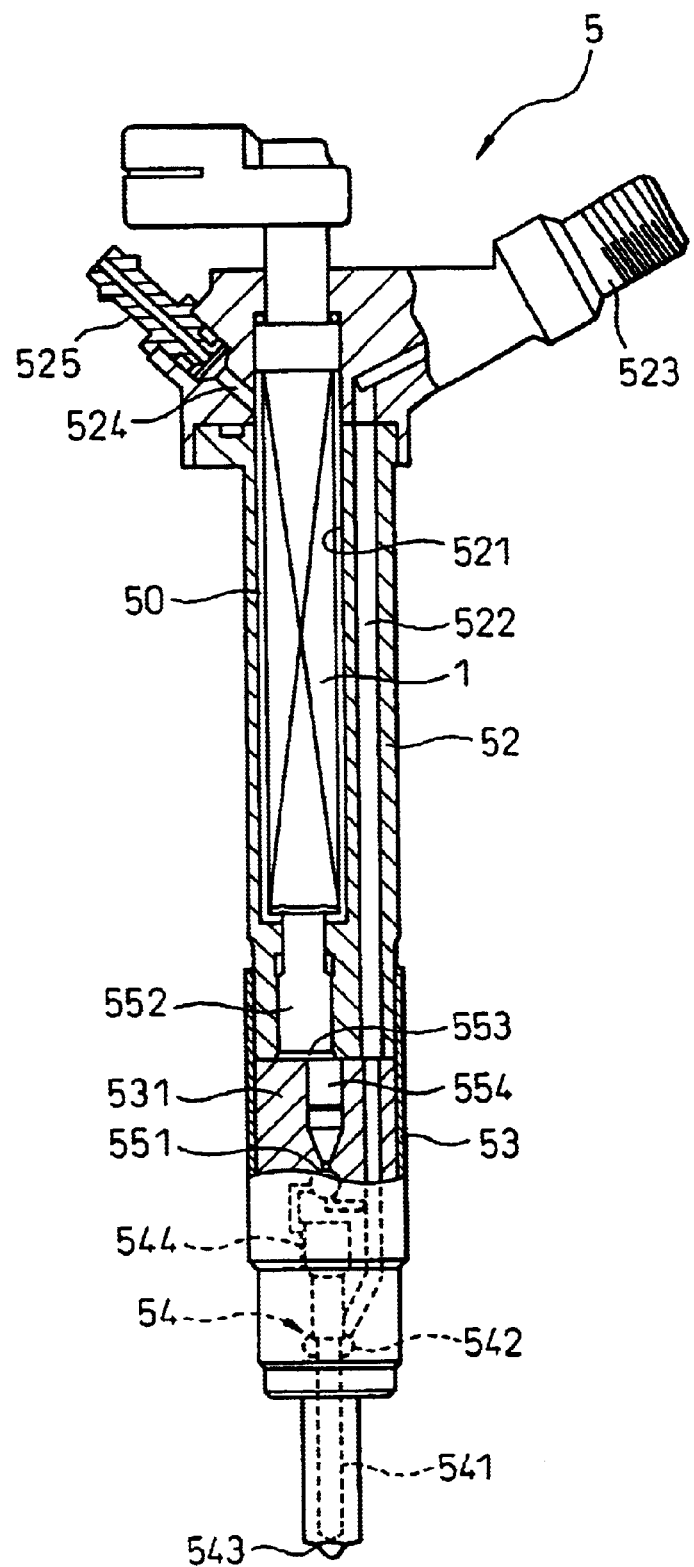
FIG. 14 is a diagram for explaining the structure of an injector according to an eighth embodiment of the invention.

The injector 5 according to this embodiment is used for a common-rail injection system of the diesel engine as shown in FIG. 14.

This injector 5, as shown in FIG. 14, includes an upper housing 52 accommodating an integrally fired, laminated electromechanical transducing element 1 as a drive unit and a lower housing 53 fixed at the lower end of the upper housing 52 and formed with an injector nozzle unit 54 therein.

The upper housing 52 is substantially cylindrical in shape and has a longitudinal hole 521 formed eccentrically of the center axis, in which the integrally fired, laminated electromechanical transducing element 1 is fixedly inserted.

A high-pressure fuel path 522 is formed on and in parallel to the side of the longitudinal hole 521. The upper end of the high-pressure fuel path 522 communicates with an external common rail (not shown) through a fuel lead-in pipe 523 projected sideways upward of the upper housing 52.

A fuel lead-out pipe 525 communicating with the drain path 524 is projected from the upper side portion of the upper housing 52, so that the fuel flowing out of the fuel lead-out pipe 525 is returned to the fuel tank (not shown).

The drain path 524 extends through a gap 50 between the longitudinal hole 521 and the drive unit (integrally fired, laminated electromechanical transducing element) 1 and by way of the gap 50, communicates with a three-way valve 551 described later through a path not shown extending downward in the upper and lower housings 52, 53.

The injection nozzle unit 54 includes a nozzle needle 541 adapted to slide vertically in a piston body 531 and an injection hole 543 for injecting the high-pressure fuel into each cylinder of the engine from a fuel pool 542 opened/closed by the nozzle needle 541. The fuel pool 542 is arranged around the intermediate portion of the nozzle needle 541 at which the lower end portion of the high-pressure fuel path 522 is opened. The nozzle needle 541 receives both the fuel pressure along the valve-opening direction from the fuel pool 542 and the fuel pressure along the valve-opening direction from a back pressure chamber 544 formed in opposed relation to the upper end surface. When the pressure in the back pressure chamber 544 drops, the nozzle needle 541 is lifted so that the injection hole 543 is opened and the fuel is injected.

The pressure of the back pressure chamber 544 is changed by the three-way valve 551. The three-way valve 551 is configured to establish communication selectively between the back pressure chamber 544 and the high-pressure fuel path 522 or between the back pressure chamber 544 and the drain path 524. In this case, the three-way valve 551 has a ball-shaped valve body adapted to open/close a port communicating with the high-pressure fuel path 522 or the drain path 524. This valve body is driven by the drive unit 1 through a large-diameter piston 552, an oil pressure chamber 553 and a small-diameter piston 554 arranged thereunder.

The drive unit 1, i.e. the integrally fired, laminated electromechanical transducing element 1 according to this embodiment, is constituted of the integrally fired, laminated electromechanical transducing element according to the first embodiment including an elongation/contraction mechanism arranged thereunder and covered wholly with a metal case (not shown).

Figure 15:
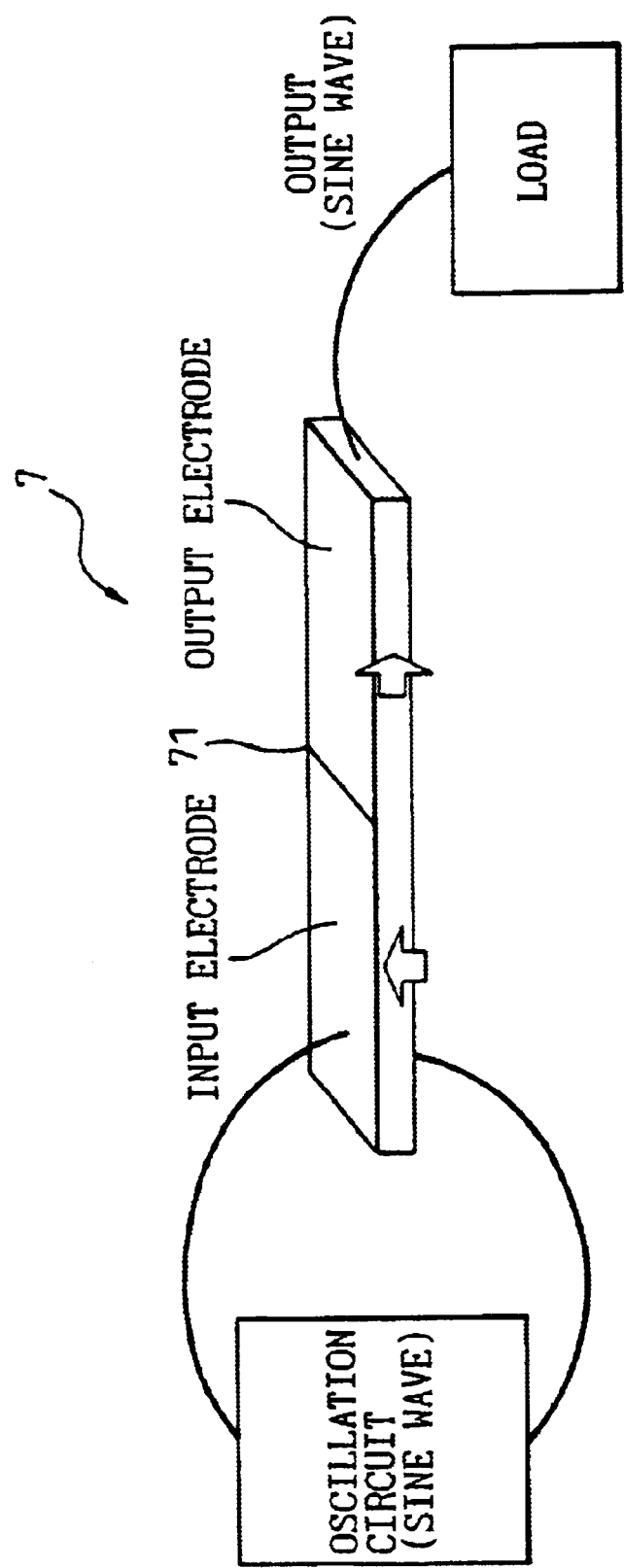
FIG. 15 is a diagram for explaining a piezoelectric inverter according to the eighth embodiment of the invention.

The injector 5 according to this embodiment employs the integrally fired, laminated electromechanical transducing element 1 having the aforementioned configuration with a Cu electrode and, therefore, both a high durability and a low cost can be achieved. The integrally fired, laminated electromechanical transducing element according to this invention can be used for the piezoelectric device for the ultrasonic motor (not shown) or the piezoelectric transducer 71 for the piezoelectric inverter 7 shown in FIG. 15.

In the piezoelectric transducer or the ultrasonic motor, for example, the integrally fired, laminated electromechanical transducing element is used for a resonant drive, and therefore the bonding strength of at least 40 MPa is required. With the Ag—Pd electrode of the integrally fired, laminated electromechanical transducing element employing a piezoelectric material or an electrostrictive material with Pb as a main component, however, the bonding strength between the electrode material and the ceramic material is not sufficient. For this reason, the bonding strength is increased by forming a portion where the upper and lower ceramic layers are bonded directly but not through the electrodes represents 7 to 25% of the whole. Nevertheless, the problem of an increased electrical resistance is posed due to a reduced electrode forming ratio. The use of the Cu electrode material forms a compound between Cu and Pb and therefore can produce a high bonding strength while keeping a high electrode forming ratio.

(Ninth Embodiment)

The rigidity and the volume resistivity of various metal materials are described in Table 3.

Table 3 shows that Cu and Al has the rigidity of not more than 160 GPa and therefore can be used for the electrodes of the electromechanical transducing element according to the invention. Nevertheless, the materials other than Cu and Al can also be used in similar fashion by making an alloy thereof, or otherwise, to achieve the rigidity of 160 GPa.

It is also seen from Table 3 that Cu has a volume resistivity approximate to that of Ag and has a superior conductivity. Thus, Cu or an alloy containing Cu is found to be a very superior electrode material.

TABLE 3

|    | Rigidity GPa | Volume resistivity $\mu\Omega$cm |
|----|----|----|
| Ag | 100.5 | 1.6 |
| Pd | 121 | 10.8 |
| Cu | 136 | 1.7 |
| Ni | 205 | 7.2 |
| Al | 75.7 | 2.7 |
| Mo | 327 | 5.5 |
| W  | 402.7 | 5.5 |

(Tenth Embodiment)

The property values, the antimigration constant Rm and the volume resistivity of various metal materials are described in Table 4.

The antimigration constant is determined by value equivalent to the sum of the ionization potential A and the thermal energy of evaporation B, multiplied by the oxide generating energy. The smaller this value, the more difficult for the migration to occur.

The materials such as Cu, Ni, Al, Mo and W have an antimigration characteristic superior to that of the conventionally known Ag/Pd 30 (meaning that the mixing ratio between Ag and Pd is 70 atomic % versus 30 atomic %). Thus, the integrally fired, laminated electromechanical transducing element according to the invention is suitable as an electrode material.

Table 4 also shows that Cu, of which the volume resistivity is quite approximate to that of Ag, has a superior conductivity and therefore is quite suitable as an electrode material.

TABLE 4

| | Ionization potential | Thermal energy of evaporation | Oxide formation energy | | Antimigration constant Rm (A + B) × C | Volume resistivity |
|---|---|---|---|---|---|---|
| | A (kJ/mol) | B (kJ/mol) | C (kJ/mol) | Compound | $(kJ/mol)^2$ | $\mu\Omega cm$ |
| Ag | 730.44 | 245.68 | −11.21 | $Ag_2O$ | −10,942 | 1.6 |
| Pd | 803.35 | 339.70 | −75 | PdO | −85,729 | 10.8 |
| Cu | 744.91 | 298.60 | −128.12 | CuO | −133,695 | 1.7 |
| Ni | 736.13 | 384.50 | −211.7 | NiO | −237,237 | 7.2 |
| Al | 577.10 | 285.80 | −1581.9 | $Al_2O_3$ | −1,365,022 | 2.7 |
| Mo | 684.73 | 612.50 | −668.1 | $MoO_3$ | −866,679 | 5.5 |
| W | 769.59 | 808.90 | −764.1 | $WO_3$ | −1,206,124 | 5.5 |
| Ag/Pd30 | | | | $Ag_2O$ and PdO | −33,378 | 15.0 |
| Ag/Pd20 | | | | $Ag_2O$ and PdO | −25,900 | 10.0 |
| Ag/Pd10 | | | | $Ag_2O$ and PdO | −18,421 | 6.0 |

(11th Embodiment)

The heat conductivity and the volume resistivity of various metal materials are described in Table 5.

As seen from Table 5, all the materials including Cu, Ni, Al, Mo and W meet the requirements for the volume resistivity of 15 $\mu\Omega$ and the heat conductivity of not less than 50 W/mK, and therefore can be used as a main component of the internal electrode layers according to the invention. The materials Ag and Pd, on the other hand, cannot meet these requirements even by themselves or as an Ag—Pd alloy as noted from the same table, and would easily develop a large energy loss in the electrode layers.

TABLE 5

| | Heat conductivity W/mK | Volume resistivity $\mu\Omega cm$ |
|---|---|---|
| Ag | 422 | 1.6 |
| Pd | 73 | 10.8 |
| Cu | 394 | 1.7 |
| Ni | 83 | 7.2 |
| Al | 239 | 2.7 |
| Mo | 136 | 5.5 |
| W | 163 | 5.5 |
| Ag/Pd 30 | 47 | 15.0 |
| Ag/Pd 30 | 70 | 10.0 |
| Ag/Pd 30 | 120 | 6.0 |

What is claimed is:

1. An integrally fired laminated electromechanical transducing element which is used for a fuel injection actuator, transducer or ultrasonic motor, said transducing element comprising:
    a laminate member formed by integrally firing a plurality of piezoelectric or electrostrictive ceramic layers with internal electrode layers interposed between the ceramic layers;
    wherein said internal electrode layers have, as a main component, a base metal having a rigidity not more than 160 GPa and selected from the group comprising Cu, a Cu alloy and an oxide thereof; and
    wherein said ceramic layers are formed of PZT which is an oxide mainly having a perovskite structure of Pb(Zr, Ti)$O_3$.

2. An integrally fired laminated electromechanical transducing element which is used for a fuel injection actuator, transducer or ultrasonic motor, said transducing element comprising:
    a plurality of piezoelectric ceramics or electrostrictive ceramic layers with internal electrode layers interposed between said ceramic layers,
    wherein said internal electrode layers contain, as a main component, a metal of which an oxide is stable in the atmosphere;
    wherein the value (A+B)×C is not more than −34,000 $(kJ/mol)^2$, where A is the ionization potential per mol of the metal (kJ/mol), B is the thermal energy of evaporation (kJ/mol) and C is the oxide formation energy of said metal (kJ/mol); and
    wherein the main component of said electrode layers is selected from the group comprising Cu, a Cu alloy and an oxide thereof.

3. An integrally fired laminated electromechanical transducing element which is used for a fuel injection actuator, transducer or ultrasonic motor, said transducing element comprising:
    a plurality of piezoelectric or electrostrictive ceramic layers with internal electrode layers interposed between said ceramic layers,
    wherein said internal electrode layers contain, as a main component, a metal of which an oxide is stable in the atmosphere;
    wherein the value (A+B)×C is not more than −34,000 $(kJ/mol)^2$, where A is the ionization potential per mol of the metal (kJ/mol), B is the thermal energy of evaporation (kJ/mol) and C is the oxide formation energy of said metal (kJ/mol); and
    wherein said ceramic layers are composed of PZT constituting an oxide having a perovskite structure mainly of Pb(Zr, Ti)$O_3$.

4. An integrally fired laminated electromechanical transducing element which is used for a fuel injection actuator, transducer or ultrasonic motor, said transducing element comprising:
    a laminate member fabricated by integrally firing a plurality of piezoelectric or electrostrictive ceramic layers with internal electrode layers interposed between said ceramic layers,
    wherein said internal electrode layers contain, as a main component, a base metal having a volume resistivity of not more than 15 $\mu\Omega cm$ and a heat conductivity of not less than 50 W/mK;
    wherein the main component of said electrode layers is selected from the group comprising Cu, a Cu alloy and an oxide thereof; and
    wherein said ceramic layers are formed of PZT constituting an oxide mainly having the perovskite structure of Pb(Zr, Ti)$O_3$.

5. An integrally fired laminated electromechanical transducing element which is used for a fuel injection actuator, transducer or ultrasonic motor, said transducing element comprising:

a plurality of piezoelectric or electrostrictive ceramic layers with internal electrode layers interposed between said ceramic layers, wherein the percentage of the ceramic layers covered by an internal electrode layer is not less than 75%;

wherein the bonding strength between said internal electrodes and said ceramic layers is not less than 40 MPa;

wherein the average thickness of said internal electrode layers is not more than 8 μm;

wherein the main component of said electrode layers is selected from the group comprising Cu, a Cu alloy and an oxide thereof;

wherein said electrode layers contain at least one component selected from the group comprising Ca, Mg and Sr; and wherein said ceramic layers are composed of PZT constituting mainly an oxide having the perovskite structure of $Pb(Zr, Ti)O_3$.

* * * * *